(12) United States Patent
Bruce et al.

(10) Patent No.: US 6,410,349 B1
(45) Date of Patent: Jun. 25, 2002

(54) INTERNAL ANTI-REFLECTIVE COATING FOR INTERFERENCE REDUCTION

(75) Inventors: Michael R. Bruce; Victoria J. Bruce; Gregory A. Dabney, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/385,774

(22) Filed: Aug. 30, 1999

(51) Int. Cl.[7] .......................... H01L 21/66; G01R 31/26
(52) U.S. Cl. ............................. 438/14; 438/72
(58) Field of Search ........................ 438/7, 8, 14, 16, 438/17, 18, 57, 72, 487, 692, 693, 694, 695

(56) References Cited

U.S. PATENT DOCUMENTS

| 5,430,305 | A | | 7/1995 | Cole, Jr. et al. | |
|---|---|---|---|---|---|
| 6,077,452 | A | * | 6/2000 | Litvak | 216/85 |
| 6,107,107 | A | * | 8/2000 | Bruce et al. | 438/14 |

OTHER PUBLICATIONS

Cullis, A.G., Webber, H.C., and Baily, P., A Device for Laser Beam Diffusion and Homogenisation, Scientific Instruments–Journal of Physics E, vol. 12 No. 8, Aug. 1979, pp. 688–689.

Kozma, A. and Christensen, C., Effects of Speckle on Resolution, Journal of the Optical Society of America, vol. 66 No. 11, Nov. 1976, pp. 1257–1260.

Martienssen, W. and Spiller, E., Coherence and Fluctuations in Light Beams, American Journal of Physics, vol. 32 No. 1–12, 1964, pp. 919–926.

Thin Film Processes II, vol. 2, 1991, p. 801.

* cited by examiner

Primary Examiner—David Nelms
Assistant Examiner—David Nhu

(57) ABSTRACT

According to an example embodiment of the present invention, an electronic circuit is formed upon a front side surface of a semiconductor device having a back side opposite the front side. At least one layer of antireflective material is formed within substrate in the semiconductor device. The circuit is stimulated and a response is analyzed. The use of the antireflective layer reduces interference generated by reflections and improves the ability to analyze the circuit.

22 Claims, 5 Drawing Sheets

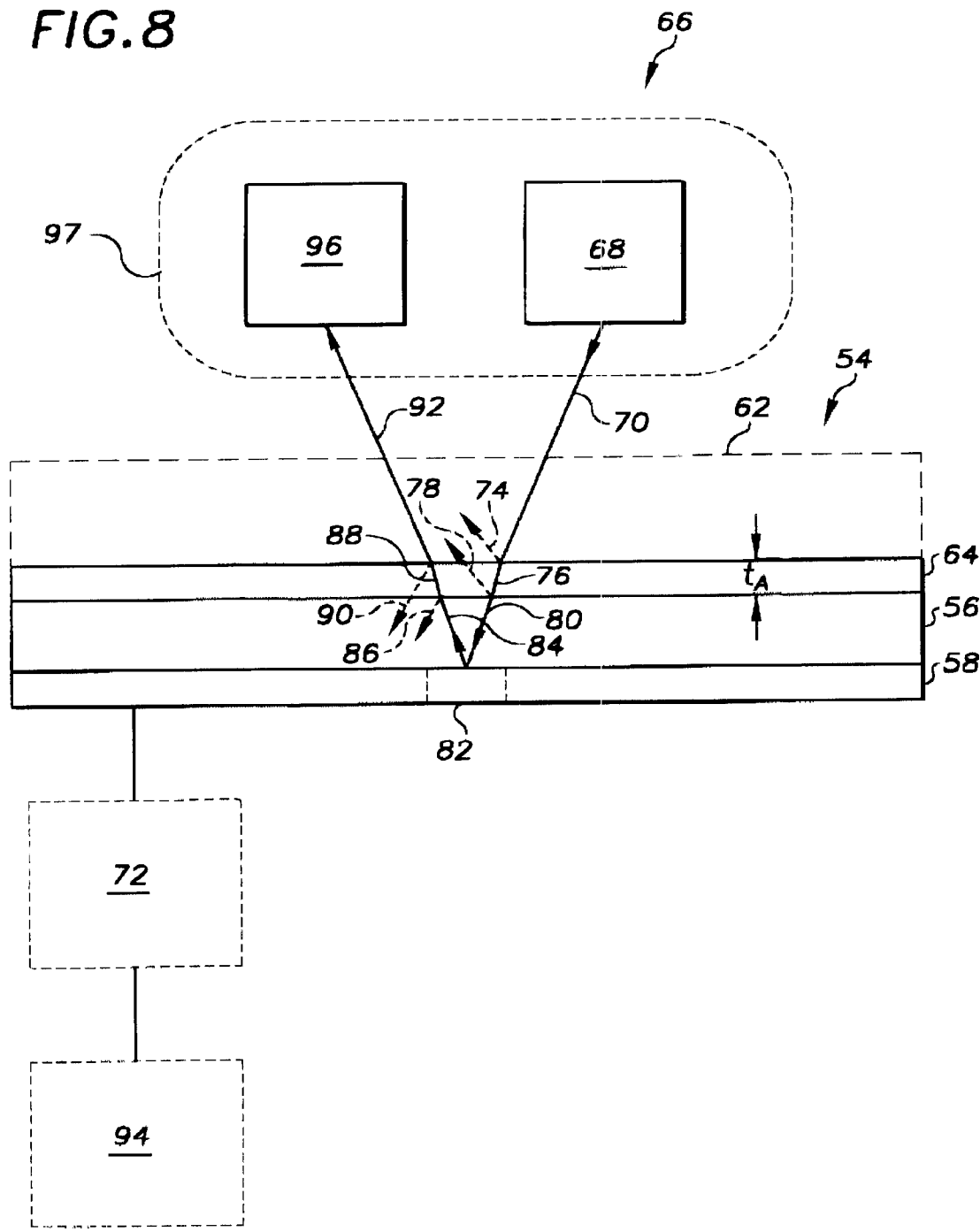

INTERNAL ANTI-REFLECTIVE COATING FOR INTERFERENCE REDUCTION

FIELD OF THE INVENTION

The invention relates to defect analysis in semiconductor device assemblies, and more particularly to techniques for accurately analyzing defects within semiconductor devices using laser scanning microscopes.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer containing the transistors and other circuitry is often referred to as the circuit side or front side of the die. The circuit side of the die is positioned very near the package and opposes the back side of the die. Between the back side and the circuit side of the die is bulk silicon.

The positioning of the circuit side near the package provides many of the advantages of the flip chip. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

With flip-chip and other packaging technologies, techniques have been developed to analyze the circuit even though the integrated circuit (IC) is buried under the bulk silicon. For example, near-infrared (nIR) microscopy is capable of imaging the circuit because silicon is relatively transparent in these wavelengths of the radiation. However, because of the absorption losses of nIR radiation in silicon, it is generally required to thin the die to less than 100 microns in order to view the circuit using nIR microscopy. For a die that is 725 microns thick, at least 625 microns of silicon is removed before nIR microscopy can be used. Another example method used for analysis of semiconductor devices via the back side is laser scanning microscopy (LSM). LSM involves scanning an incident beam across a surface of a specimen and detecting the intensity of an exit beam emerging from the surface. Using the exit beam, structures within the specimen can be imaged.

In addition to imaging a semiconductor device, other methods for analyzing semiconductor devices include detecting a response via the back side. For example, circuitry within the semiconductor device can be excited to generate a detectable response. Various methods are available for exciting circuitry and include using a power supply, stimulating circuitry with an electromagnetic radiation source, and directing an ion beam at the back side. Using these techniques, a characteristic of the semiconductor device can be determined.

The aforementioned example techniques are useful for analyzing semiconductor devices. However, problems have been observed in imaging and analyzing the circuit and stimulating device components in accordance with the above described techniques. With imaging methods, significant background laser intensity levels have been observed. While stimulating the electronic components, weak response levels have been experienced, and control of the stimulation is hindered via the existence of reflections or interference, in the device. In addition, interference patterns from reflections and other sources impede the efficacy of imaging processes. These and other problems associated with reflections in semiconductor device manufacture and analysis have been a hindrance to the advancement of semiconductor technologies.

SUMMARY OF THE INVENTION

The present invention is exemplified in a number of implementations and applications, some of which are summarized below. According to an example embodiment of the present invention, an electronic circuit is formed upon a front side surface of a semiconductor device having a back side opposite the front side. At least one layer of antireflective material is formed within substrate in the back side of the semiconductor device. The circuit is stimulated and the response to the stimulation is analyzed. The use of the antireflective layer reduces reflections including interference patterns, and improves the analysis of the device.

According to another example embodiment of the present invention, a semiconductor device is manufactured. The device comprises a front side and a back side opposite the front side. An electronic circuit is formed upon the front side surface, and at least one layer of antireflective material is formed in the substrate of the back side. The antireflective material is configured and arranged to prevent interference patterns from emanating from or reflecting back to the device.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 8 is a cross-sectional view of the semiconductor of FIG. 5 undergoing analysis, according to another example embodiment of the present invention.

Figure 1:
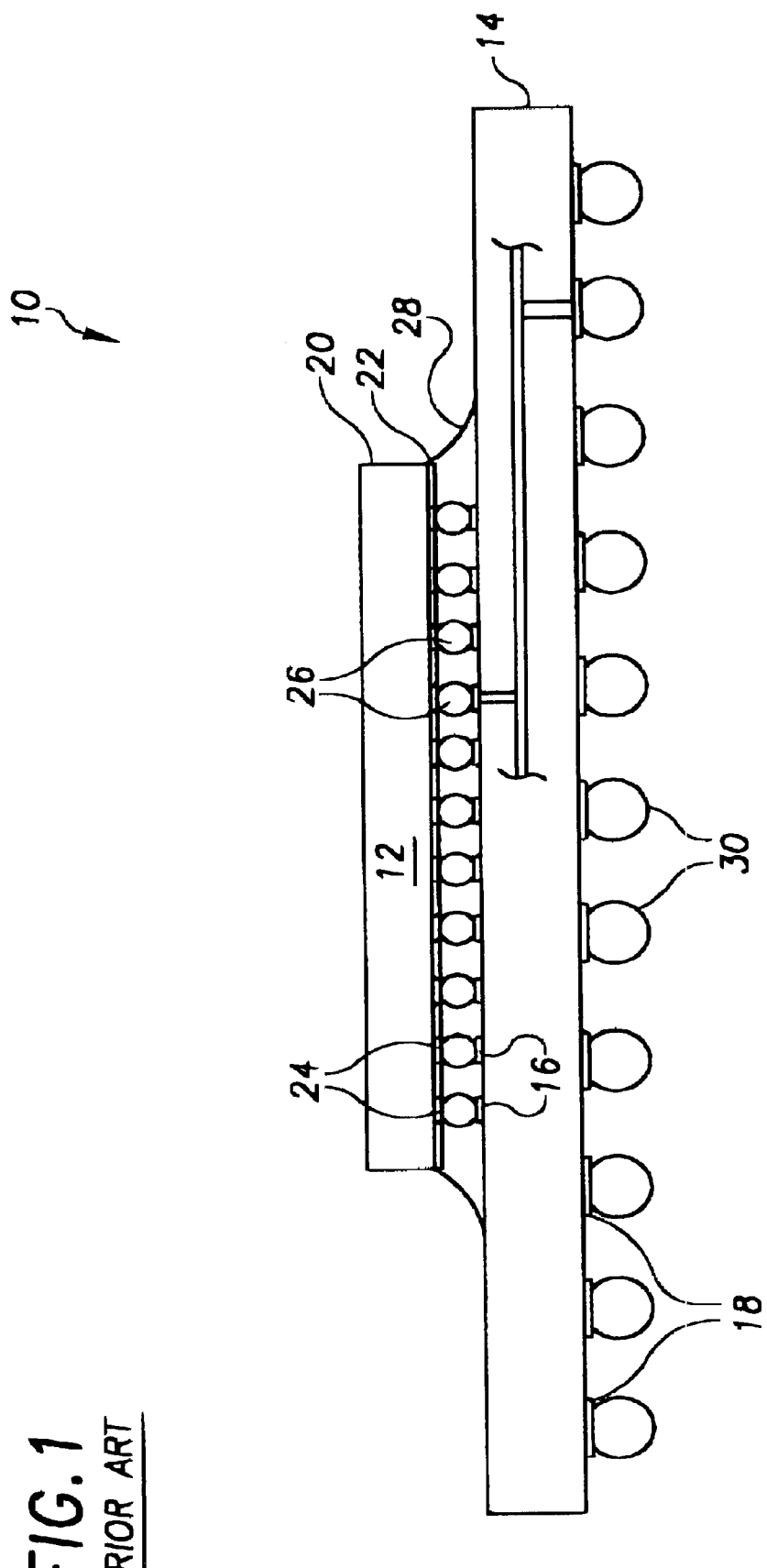
FIG. 1 is a cross-sectional view of an exemplary ball grid array (BGA) device including an integrated circuit mounted upon a larger package substrate, consistent with an example embodiment of the present invention, wherein an electronic circuit is formed upon a front side of a semiconductor substrate of the integrated circuit, and wherein the front side surface of the semiconductor substrate is connected to the package substrate such that the front side surface is inaccessible with conventional circuit probing techniques.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices requiring or benefiting from back side analysis. While the present invention is not limited to such devices, an appreciation of various aspects of the invention is best gained through a discussion of various examples using this application.

Various methods and apparatuses for analyzing semiconductor devices having a circuit side opposite a back side involve imaging and analyzing the circuit side via the back side. A particular difficulty that has plagued such imaging and analysis is the proliferation of interference patterns which adversely affect the imaging pattern, as well as other reflections that can return to and excite the circuit side and affect the performance or analysis of the device. Interference can occur and be influenced in several manners, such as via the application of non-uniform laser beams, the existence of a non-planar back side surface, the illumination of diffuse objects with coherent laser radiation, reflections from substrate surfaces, and the existence of non-uniform indexes of refraction for silicon in such devices. Such interference hinders the applicability and accuracy of circuitry imaging and analysis via the back side. According to an example embodiment of the present invention, it has been discovered that interference patterns that are associated with imaging and analyzing semiconductor devices can be reduced via the formation of antireflective material on the substrate of the semiconductor device. The antireflective material may, for example, include lead fluoride ($PbF_2$), ZiO and SiO are also acceptable. The improved imaging and analysis ability can be used for purposes including locating defects within the device and generating an image of the circuitry.

The antireflective material is formed to prevent reflections from portions of the semiconductor device the substrate surface. The high index of refraction of doped silicon (in the range of 3.4 to 3.8) is conductive to high reflectivities at the air/silicon interface of 30–40%.

A particular application of the present invention includes the analysis of flip-chip type semiconductor devices. FIG. 1 shows an example flip-chip package that can be used in connection with the present invention. FIG. 1 is a cross-sectional view of an exemplary ball grid array (BGA) device 10 including an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a front side surface of semiconductor substrate 20 during wafer fabrication. The electronic components are connected by electrically conductive interconnect lines, forming an electronic circuit.

Multiple input/output (I/O pads) 24 are also formed within circuit layer 22. I/O pads 24 are typically coated with solder, forming solder "bumps" 26.

The integrated circuit is attached to the package substrate using the controlled collapse chip connection (C4® or "flip chip") method. During the C4® mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate. After integrated circuit 12 is attached to package substrate 14, the region between integrated circuit 12 and package substrate 14 is filled with an "underfill" material 28 which encapsulates the C4® connections and provides other mechanical advantages.

Package substrate 14 may be made of, for example, fiberglass-epoxy printed circuit board material or ceramic material (e.g., aluminum oxide, alumina, $Al_2O_3$, or aluminum nitride, AlN). Package substrate 14 includes one or more layers of signal lines (i.e., interconnects) which connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted to an ordinary PCB. During PC assembly, BGA device is attached to the PCB by reflow of solder balls 30 just as the integrated circuit is attached to the package substrate.

The C4® mounting of integrated circuit 12 to package substrate 14 prevents physical access to circuit layer 22 for failure analysis and fault isolation. However, several analytic and diagnostic techniques developed to reveal defects and logic states within integrated circuits are also useful when applied to flip chip grid array devices. Some of these techniques involve stimulation of a target portion of circuit layer 22 with electromagnetic radiation. For example, silicon substrates transmit a significant fraction of incident laser light having wavelengths from about 1,000 nanometers to upwards of 1,800 nanometers. Photons of laser light with wavelengths from about 1,000 nanometers to approximately 1,200 nanometers have sufficient energy to create electron-hole pairs in some silicon substrates used for wafer fabrication when absorbed during collisions with atoms of elements within the silicon substrates. The electrons and holes (i.e., charge carriers) thus created cause detectable changes in (i.e., stimulate) an isolated target portion of circuit layer 22. Photons of laser light having wavelengths greater than or equal to about 1,300 nanometers lack sufficient energy to create electron-hole pairs during collisions. However, the magnitude and/or phase of a reflected portion of an incident laser beam having a wavelength of about 1,300 nanometers or greater is affected by electric fields and charge modulation effects existing within circuit layer 22. Techniques which detect the reflected portion allow imaging within the silicon substrates.

In a more particular example embodiment of the present invention, a semiconductor device having an electronic circuit formed in a circuit side and a back side opposite the circuit side is manufactured. At least one layer of antireflective material is formed within the semiconductor substrate. The layer may, for example, be formed during the formation of substrate in the back side while the device is being manufactured. In another example, the layer is formed after at least a portion of the semiconductor device has been manufactured, wherein substrate is removed from the back side prior to forming the antireflective layer.

Figure 2:
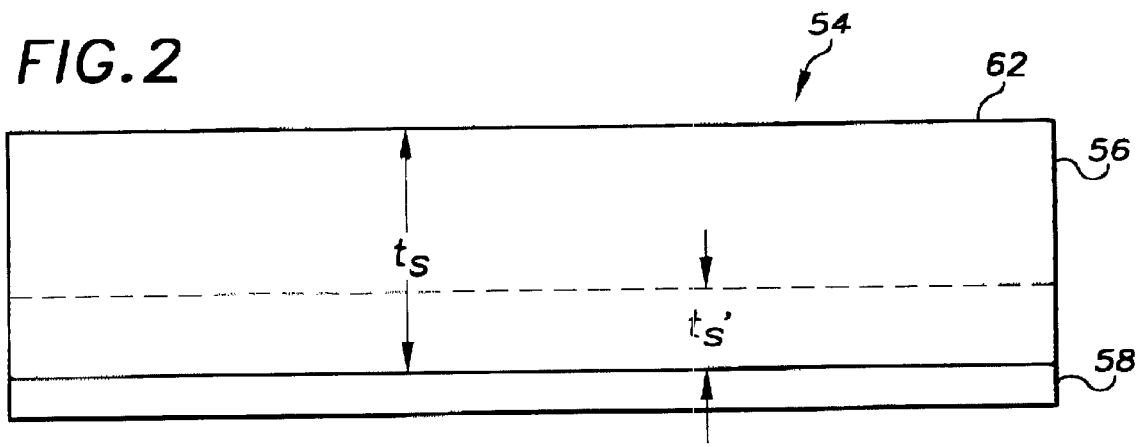
FIG. 2 is a cross-sectional view of a semiconductor device, consistent with an example embodiment of the present invention, prior to formation of an antireflective layer in the device.
Figure 3:
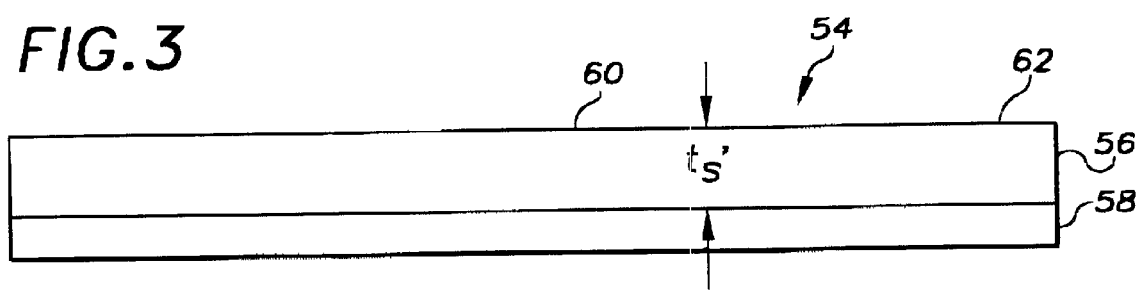
FIG. 3 is a cross-sectional view of a semiconductor device prior to formation of an antireflective layer in the device, wherein a portion of the back side of the device has been removed, according to an example embodiment of the present invention.
Figure 4:
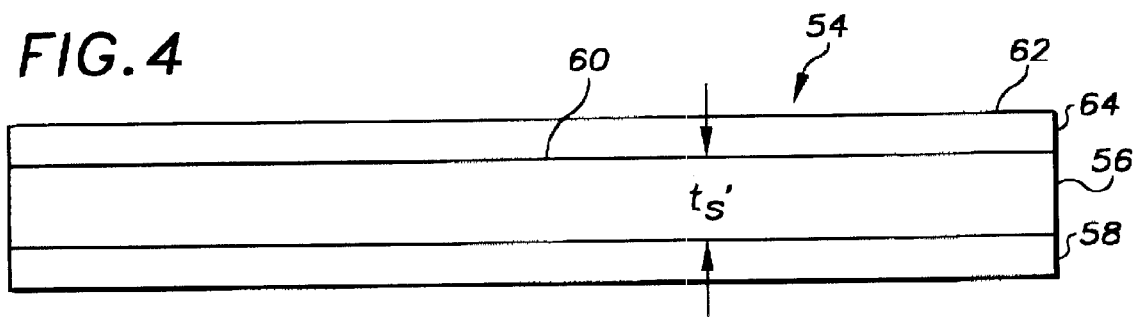
FIG. 4 is a cross-sectional view of a semiconductor device having an antireflective layer formed on a portion of the back side of the device, according to another example embodiment of the present invention.
Figure 5:
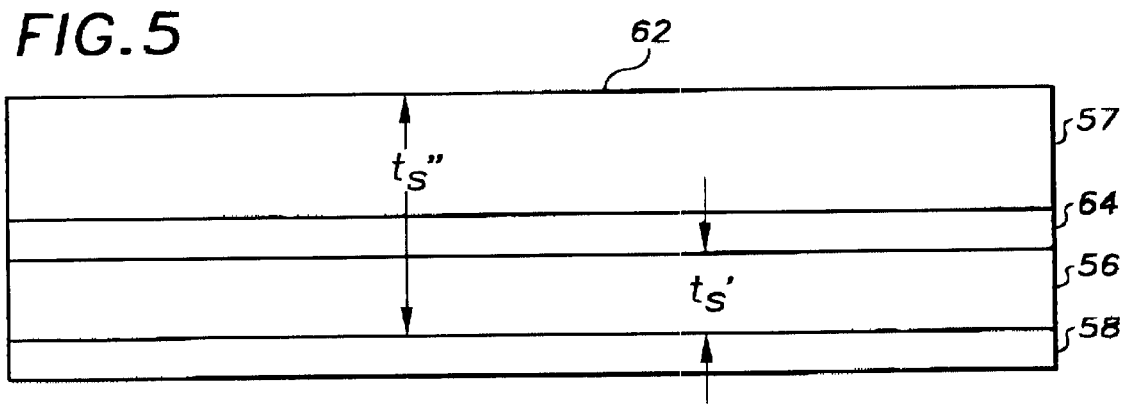
FIG. 5 is a cross-sectional view of a semiconductor device having an antireflective layer formed on a portion of the back side of the device and wherein substrate has been formed over the antireflective layer, according to another example embodiment of the present invention.

Referring now to FIGS. 2–5, an antireflective layer is formed using at least one of several methods, according to another example embodiment of the present invention. For example, an antireflective layer can be formed within a semiconductor by first removing substrate from the back side of the device, then forming the antireflective layer, and then re-forming substrate in the back side over the antireflective layer. To illustrate this example embodiment, FIG. 2 shows a semiconductor device 54 that is formed without having an antireflective layer within the device. The semiconductor device includes a circuit side 58 and a back side 62 opposite the circuit side 58 and substrate 56 in the back side 62. The substrate 56 may, for example, be substantially transparent to a laser source of a laser scanning microscope. The thickness of the back side is represented by $t_S$. Substrate in the back side 62 is removed and an exposed region 60 is formed, as shown in FIG. 3. The thickness of the back side after substrate removal is represented by $t_{S'}$. After the exposed region 60 has been formed, an antireflective layer 64 is deposited on the exposed region 60, as shown in FIG. 4. Substrate is then re-formed over the antireflective layer 64 to a thickness $t_{S''}$, as shown in FIG. 5.

In another example embodiment of the present invention, and referring to FIGS. 3–5, an antireflective layer 64 is formed within a semiconductor device 54 during the manufacture of the device. Substrate 56 having a thickness $t_{S'}$ is formed in a back side 62 and over a circuit side 58 in FIG. 3. An antireflective layer 64 is formed over the surface 60 of the substrate 56 in FIG. 4. After the formation of the antireflective layer 64, additional substrate 57 is formed over the antireflective layer 64 to a thickness of $t_{S''}$ in FIG. 5.

According to another example embodiment of the present invention, a semiconductor device having an antireflective layer formed within the back side of the device is analyzed before the manufacture of the device is complete. As described herein above in connection with FIGS. 3–5, FIG. 4 shows an antireflective layer 64 formed over a portion of substrate 56 in the back side 62 of a semiconductor device 54. At this point in the manufacturing process, and before additional substrate is formed over the antireflective coating 64, the device is analyzed. The device may be analyzed via electrical detection, such as via a power supply or other monitor coupled to the circuitry. In addition, the device may be analyzed via imaging the back side, such as by laser scanning microscopy or other photo-emission detection.

Figure 6:
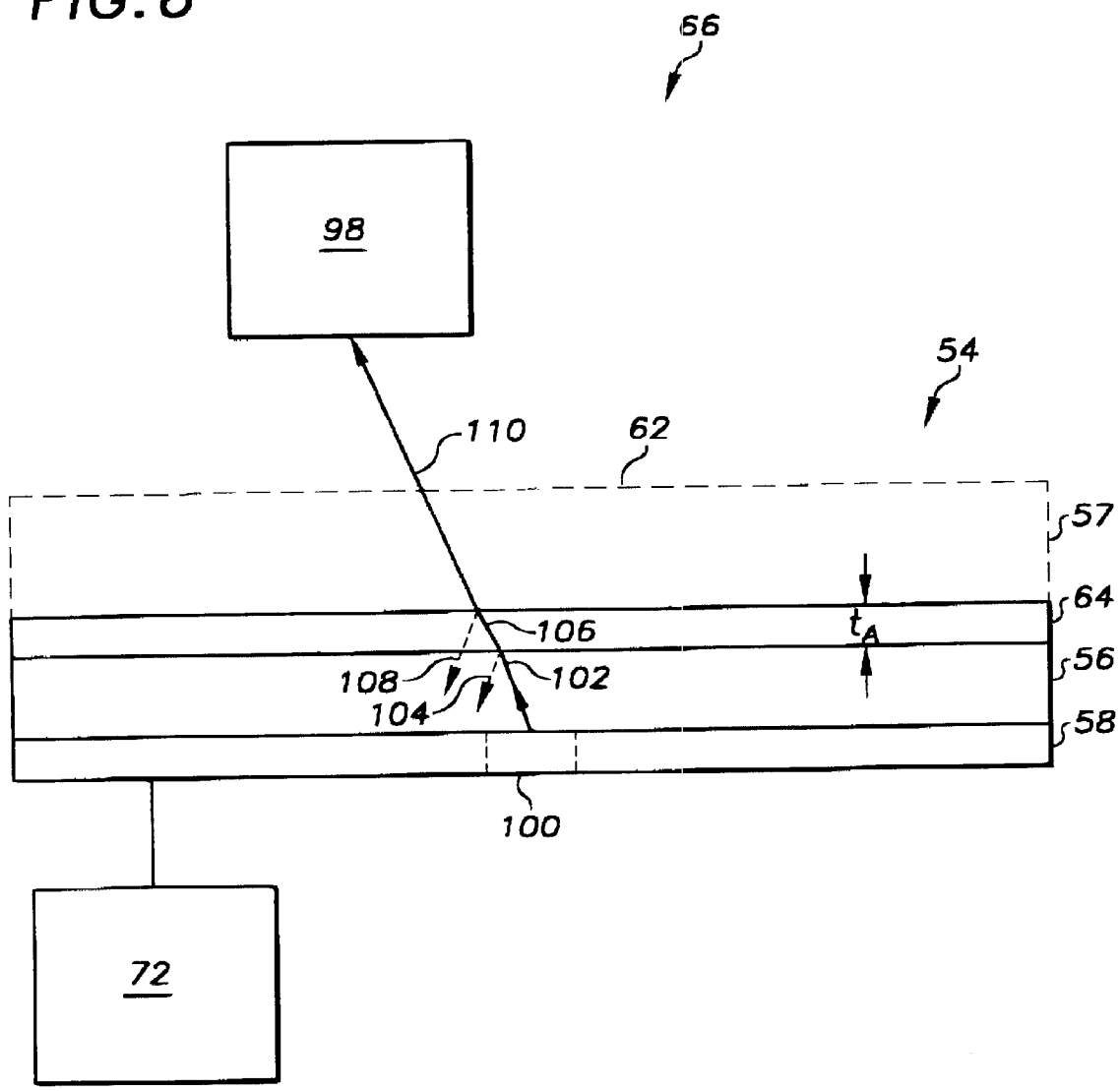
FIG. 6 is a cross-sectional view of the semiconductor of FIG. 4 undergoing analysis, according to another example embodiment of the present invention.

For example, FIG. 6 shows the device 54 of FIG. 4 undergoing test during its manufacture, or after it has been manufactured and subsequent to substrate removal. A power supply 72 is coupled to circuitry 100 in the circuit side 58. In response to the power supply 72, the device emits radiation 102. The radiation 102 passes through the substrate 56 and encounters the antireflective layer 64. The antireflective layer 64 preferably has a thickness $t_A$ of about ¼ of the wavelength of the radiation 102. When the radiation 102 encounters the lower side of the antireflective layer 64, a portion 104 of the radiation is reflected back toward the circuit side 58. Another portion of the radiation 106 continues through the antireflective coating. When the radiation portion 106 encounters the upper side of the antireflective layer 64, a portion 108 of the radiation portion 106 is reflected back toward the circuit side 58. When the thickness of the antireflective layer is about ¼ of the wavelength of the radiation, the reflected portions 104 and 108 are about 180 degrees out of phase, effectively canceling the reflection to the circuit side 58. Portion 110 continues out of the antireflective layer 64 and can be detected by device 98. Subsequent to testing the device, additional substrate 57 is formed over the antireflective layer 64, as shown by a phantom line.

Canceling the reflection back to the circuit side is advantageous because it reduces additional effects that the reflected radiation can have on the circuit. For instance, reflected radiation can affect the operating characteristics of the device by exciting circuitry. By reducing or eliminating the effect that the reflection has on the circuit, the analysis of the device includes less interference and more accurately depicts the characteristics of the device.

In addition to powering the device and using an antireflective layer to cancel reflections back to the circuit side, as shown in FIG. 6, other methods for analysis during manufacture of the device can benefit from the antireflective layer. For instance, a laser directed at the back side can cause reflections in a similar manner. Absent an antireflective layer, a laser beam directed at the back side can reflect from the back side and create interference that affects the ability to image the device. Referring again to FIG. 6, radiation 102 could be a reflection from a laser directed at the back side of the device. The antireflective layer prevents the laser reflection 102 from reflecting back to the circuit side, preventing unwanted stimulation of circuitry in the circuit side. The use and effect of a laser is described herein below and with reference to FIG. 8 for methods of analysis subsequent to manufacturing the device.

Figure 7:
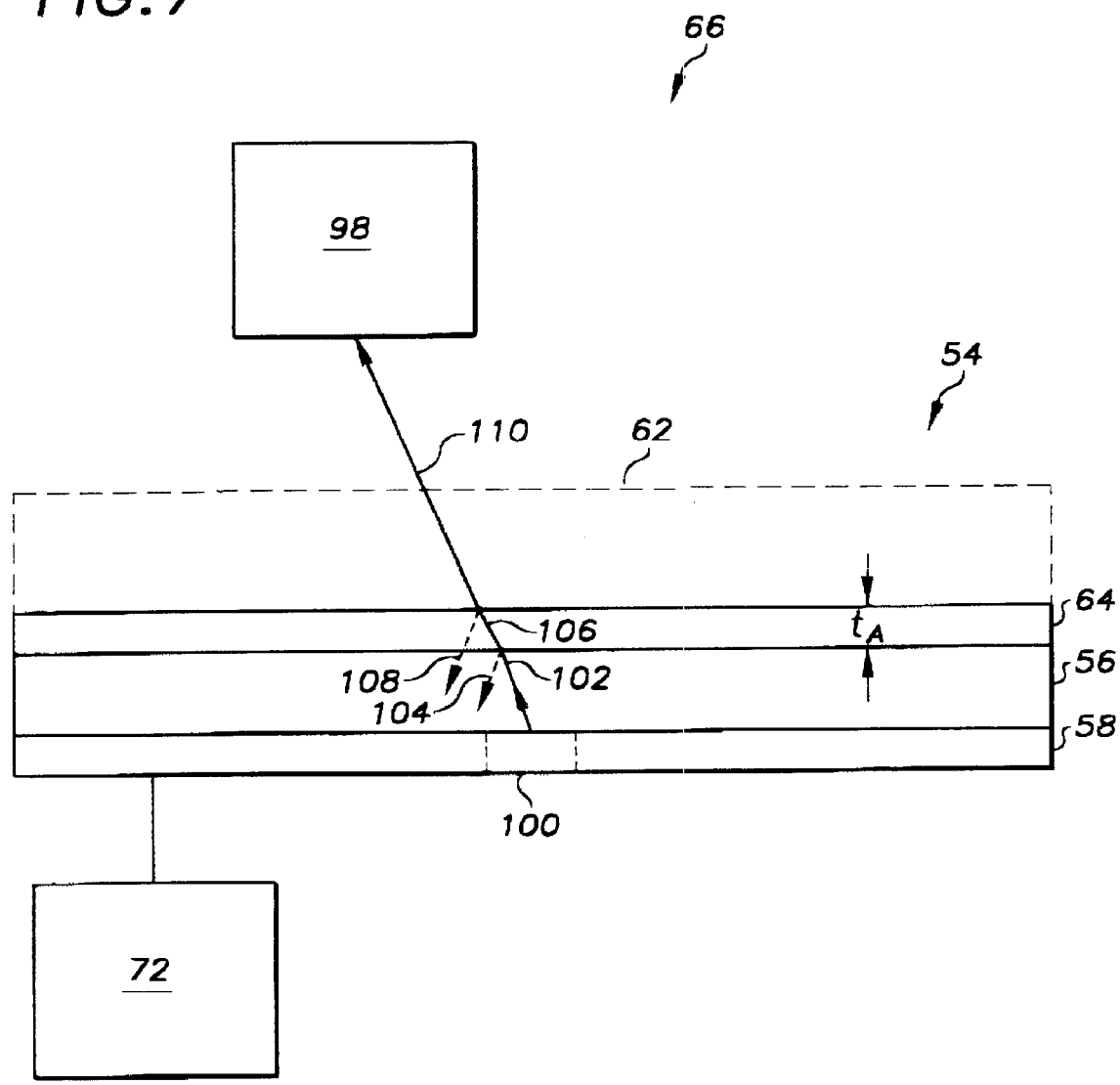
FIG. 7 is a cross-sectional view of the semiconductor of FIG. 5 undergoing analysis, according to another example embodiment of the present invention.

According to another example embodiment of the present invention, FIG. 7 shows the semiconductor device of FIG. 5 under analysis subsequent to its manufacture. A circuit side 58 in a semiconductor device 54 is coupled to a power supply 72, and the device 54 is powered. A portion of the circuit side 100 emits radiation 102 in response to the power supply 72. The radiation 102 encounters an antireflective layer 64 having a thickness of about ¼ the wavelength of the radiation 102. Portions of radiation 102 are reflected as radiation portions 104 and 108. The reflected radiation portions 104 and 108 are about 180 degrees out of phase and effectively cancel each other out. The portion of the radiation 102 that passes through the antireflective layer 64 exits the back side 62 as radiation portion 110 that is detected at detector 98.

Referring now to FIG. 8, and according to another example embodiment of the present invention, the semiconductor device 54 of FIG. 5 is analyzed using a laser source 68 directed at the back side 62 of the semiconductor device 54. Laser beam 70 encounters the antireflective layer 64 and a portion 74 is reflected. Another portion of the beam 76 continues into the antireflective layer 64 and is reflected as portion 78. The antireflective layer has a thickness $t_A$ of about ¼ the wavelength of the laser beam 70. For example, the laser beam can be created using a neodymium:yttrium-aluminum-garnet (Nd:YAG) based laser source. Due to the thickness of the antireflective layer, the reflected portions 74 and 78 are about 180 degrees out of phase and cancel each other out. A portion 80 of the laser beam continues through the back side 62 and encounters a portion of the circuitry 82 and reflects as reflection 84. In a similar manner to beam 70, reflection 84 encounters the antireflective layer 64 and reflects as portions 86 and 90. Portions 86 and 90 are 180 degrees out of phase and cancel each other out. Portion 88 continues through the antireflective layer and continues as portion 92 out the back side 62 of the device. Portion 92 is then detected at detector 96. According to a more particular example embodiment, laser source 68 and detector 96 are included in a laser scanning microscope arrangement 97. In another more particular example embodiment, the detector 96 includes a photo-emission microscope.

In another example embodiment of the present invention, and referring again to FIG. 8, a power supply 72 and monitor 94 are coupled to the semiconductor device 62. The power supply is used to power circuitry in the circuit side 58, such as circuitry 82. The laser source 68 and detector 96 is used to analyze the circuitry in response to the power supply 72. In addition, monitor 94 can be used to monitor the power supply and analyze the circuitry therefrom. For instance, the power supply can be used to supply a constant current to the semiconductor device 54. The laser source 68 can be directed at the back side and used to stimulate circuitry 82. The monitor 94 is then used to monitor variations in the voltage of the power supply 72 in response to the laser source 68. In addition, the power supply can be used to stimulate the circuitry 82 and affect the reflection 84. The use of the power supply 72 and monitor 94 provide additional useful applications wherein the antireflective layer 64 is beneficial. In a more particular example embodiment, the laser source 68, detector 96, power supply 72, and monitor 94 are part of a test fixture for mounting and analyzing the semiconductor device 54.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing an electronic circuit formed upon a front side surface of a semiconductor device having a back side opposite the front side, the back side having substrate, the method comprising:
    forming at least one layer of antireflective material within the semiconductor substrate;
    stimulating the circuit; and
    responsive to stimulating the circuit, analyzing the electronic circuit.

2. A method, according to claim 1, wherein stimulating the circuit includes directing a beam of electromagnetic radiation at the back side of the device.

3. A method, according to claim 1, wherein analyzing the circuit includes using a laser scanning microscope and imaging the circuit.

4. A method, according to claim 1, wherein analyzing the circuit includes using a photo-emission microscope and detecting a circuit response to the stimulation.

5. A method, according to claim 4, further comprising locating a defect in the semiconductor chip.

6. A method, according to claim 1, wherein forming the at least one layer of antireflective material includes forming the layer during the manufacture of the device.

7. A method for analyzing an electronic circuit formed upon a front side surface of a semiconductor device having a back side opposite the front side, the back side having substrate, the method comprising:
    forming at least one layer of antireflective material on the semiconductor substrate including
    removing a portion of substrate from the back side of the semiconductor device, and
    subsequent to removing a portion of substrate, forming a layer of antireflective material, and forming additional substrate over the antireflective material;
    stimulating the circuit; and
    responsive to stimulating the circuit, analyzing the electronic circuit.

8. A method, according to claim 1, further comprising:
    removing substrate from the back side of the semiconductor device; and
    exposing at least a portion of the antireflective layer.

9. A method, according to claim 1, wherein the antireflective material blocks about all interference patterns emanating from and reflecting back to the circuit.

10. A method, according to claim 1, further comprising forming a plurality of layers of antireflective coating material within the semiconductor device.

11. A method, according to claim 3, wherein the laser beam from the laser scanning microscope is coherent, and wherein the at least one antireflective layer prevents about all of any interference created by the laser beam from reaching the microscope.

12. A method, according to claim 1, wherein stimulating the circuit comprises coupling the circuit to a power supply and powering the device.

13. A method, according to claim 12, wherein analyzing the electronic circuit includes detecting a response via the power supply.

14. A method, according to claim 12, wherein analyzing the electronic circuit includes detecting a response via a laser scanning microscope.

15. A method, according to claim 12, wherein powering the device comprises supplying power having a constant current, and wherein the circuit response includes a change in voltage.

16. A method for manufacturing and analyzing an electronic circuit formed upon a front side surface of a semiconductor device having a back side opposite the front side, the method comprising:

forming at least one layer of antireflective material within the semiconductor substrate during manufacture of the device, wherein the layer has a thickness of about ¼ the wavelength of a neodymium:yttrium-aluminum-garnet (Nd:YAG) based laser;

placing the device in a test fixture, wherein the test fixture includes a power supply;

coupling the power supply to the semiconductor device and powering the device;

directing a laser scanning microscope having a Nd:YAG source at the back side of the device; and generating an image of at least a portion of the electronic circuit via the laser scanning microscope.

17. A method, according to claim 1, further including and responsive to analyzing the electronic circuit, forming additional substrate over said at least one layer of antireflective material.

18. A method, according to claim 17, wherein analyzing the circuit includes using a monitor electrically coupled to the circuit.

19. A method, according to claim 17, wherein said at least one layer of antireflective material has a certain thickness, and wherein analyzing the circuit includes using a laser beam having a wavelength defined as a function of the certain thickness.

20. A method, according to claim 19, wherein the wavelength is about one quarter of the wavelength of the certain thickness.

21. A method, according to claim 1, wherein said at least one layer of antireflective material has a certain thickness, and wherein analyzing the circuit includes using a laser beam having a wavelength that is about one quarter of the wavelength of the certain thickness.

22. A method, according to claim 21, wherein the laser beam is directed at the circuit through said at least one layer of antireflective material and reflections of the laser beam are canceled due the laser beam having a wavelength that is about one quarter of the wavelength of the certain thickness.

\* \* \* \* \*

UNITED STATES PATENT AND TRADEMARK OFFICE
CERTIFICATE OF CORRECTION

PATENT NO. : 6,410,349 B1
DATED : June 25, 2002
INVENTOR(S) : Bruce et al.

It is certified that error appears in the above-identified patent and that said Letters Patent is hereby corrected as shown below:

<u>Column 4,</u>
Lines 17-18, no new paragraph.
Line 19, insert -- via -- after the word "device".
Lines 40-41, no new paragraph.

<u>Column 7,</u>
Line 45, "is" should read -- are --.

Signed and Sealed this

Eighth Day of April, 2003

JAMES E. ROGAN
*Director of the United States Patent and Trademark Office*